(12) United States Patent
Benes et al.

(10) Patent No.: US 6,825,653 B2
(45) Date of Patent: Nov. 30, 2004

(54) LOAD COMPENSATING POWER SUPPLY HAVING MINIMALLY INVASIVE DEVICE CURRENT ANALYZER

(75) Inventors: Michael Joseph Benes, Irvington, NJ (US); James R. Medunick, Newton, NJ (US); Russell A. Clegg, Hibernia, NJ (US)

(73) Assignee: Agilent Technologies, Inc., Palo Alto, CA (US)

( * ) Notice: Subject to any disclaimer, the term of this patent is extended or adjusted under 35 U.S.C. 154(b) by 47 days.

(21) Appl. No.: 10/321,523

(22) Filed: Dec. 18, 2002

(65) Prior Publication Data

US 2004/0119460 A1 Jun. 24, 2004

(51) Int. Cl.$^7$ ............................................... G01R 31/00
(52) U.S. Cl. ................................................... 324/158.1
(58) Field of Search ............................ 324/73.1, 158.1, 324/601, 500, 537, 676, 678; 714/736, 724; 702/104, 85

(56) References Cited

U.S. PATENT DOCUMENTS

| 5,578,932 A | * | 11/1996 | Adamian | ..................... 324/601 |
| 6,040,689 A | * | 3/2000 | Gluszek | ..................... 324/127 |

* cited by examiner

Primary Examiner—Vinh P. Nguyen

(57) ABSTRACT

An apparatus for and a method of making very accurate non-invasive current measurements of current flowing from a power source to a device under test (DUT). A power supply, which operates in a pass through mode and which incorporates a plurality of sense leads, compensates for voltage drops due to system wiring and measurement shunts within the bandwidth limits of the power supply. The resulting circuit voltage and impedance seen by the load, after the addition of the measurement system and system wiring, is nearly identical to the power source's output voltage and impedance.

18 Claims, 4 Drawing Sheets

LOAD COMPENSATING POWER SUPPLY HAVING MINIMALLY INVASIVE DEVICE CURRENT ANALYZER

CROSS-REFERENCE TO RELATED APPLICATIONS

Not Applicable

BACKGROUND OF THE INVENTION

1. Field of the Invention

The present invention relates to an apparatus for and a method of making very accurate non-invasive measurements of electrical current flowing from a power source to a device under test (DUT).

2. Description of the Related Art

In testing of electronic devices, voltage and current waveforms are often measured during various modes of operation of the electronic device as an indicator of proper device functionality. In order to make waveform measurements, the power source which is used for supplying power to the electronic device under test (DUT) must be separated from the DUT to allow for addition of measurement instruments. Referring to FIG. 1, ideally, power is supplied from a voltage source 103 to a device under test 102 and no additional series impedance is encountered between the voltage source 103 and the device under test 102. Therefore, the open circuit voltage at the DUT is equal to $V_S$ and the DC source impedance of the voltage source 103 is equal to $R_S$. In order to make the necessary current measurements a measurement system and wiring are added to the circuit, which introduces non-desirable impedances.

In a conventional measurement system shown in FIG. 2, a device under test 102 is supplied from a power source 103 through wire impedances which are indicated as lumped parameters $Z_A$ and $Z_C$. A current is sensed by a non-contact measuring probe 104, such as for example, a current transformer or a hall effect sensor, and a representation of the current is displayed on an oscilloscope 105. However, in such a measuring system, a transient voltage dip and overshoot results due to the additional insertion impedances of the probe, as well as from $Z_A$ and $Z_C$. This voltage transient can overvoltage or undervoltage the DUT, potentially terminating the intended test or damaging the DUT.

Another conventional measuring system is shown in FIG. 3. A current measurement shunt $R_M$ is inserted in series with the voltage source 103 and the device under test 102. An additional voltage drop will be realized due to the measurement shunt $R_M$ and the wire impedances, represented by the lumped parameters $Z_A$, $Z_B$ and $Z_C$.

Yet another conventional measuring system is shown in FIG. 4. Using a dc power supply 106 with conventional two-wire sense, in a pass through mode where the supply is set to zero volts, current from the voltage source 103 can be measured. By using inputs sense (−) and sense (+), the power supply 106 compensates for voltage drops across the measurement system 106 and the impedances $Z_A$ and $Z_B$ but not for a voltage drop across the impedance $Z_C$.

SUMMARY OF THE INVENTION

In the present invention, a second set of sense leads is provided for the power supply. This allows the supply to compensate for the additional voltage drop across impedance $Z_C$ within the bandwidth limitations of the power supply. By setting the power supply to zero volts a total of the errors introduced by the measurement system, $Z_A$, $Z_B$, and $Z_C$ is reduced nearly to zero within the bandwidth limits of the power supply. As a result, the open circuit voltage and source impedance at the DUT equals $V_S$ and $R_S$ respectively. Thus the required current measurements may be taken in a non-invasive manner.

BRIEF DESCRIPTION OF THE DRAWINGS

The present invention will become more apparent and more readily appreciated from the following description of the various embodiments, taken in conjunction with the accompanying drawings in which.

DESCRIPTION OF THE PREFERRED EMBODIMENTS

Figure 1:
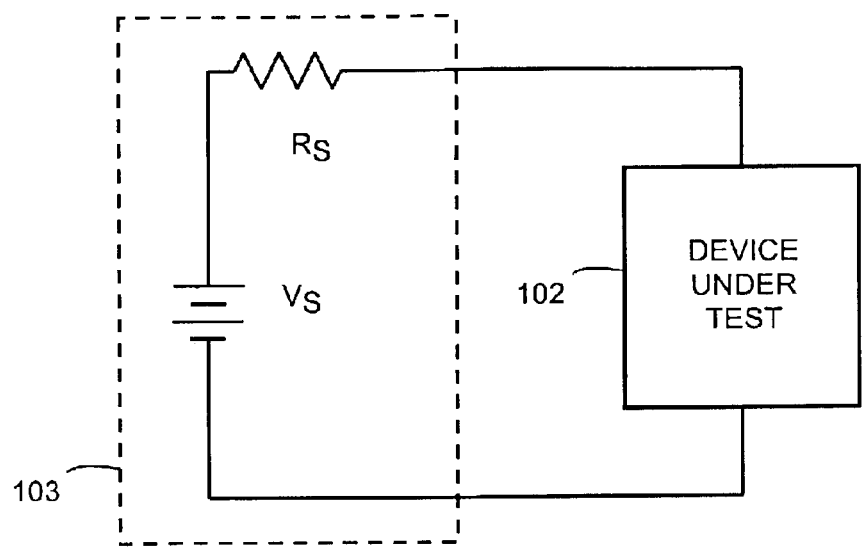
FIG. 1 is a block diagram of a voltage source and a load.
Figure 2:
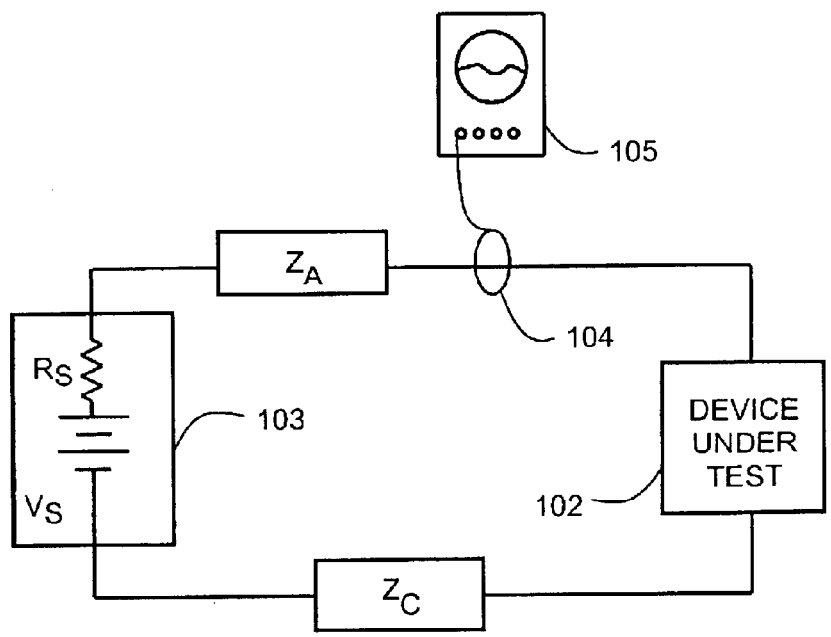
FIG. 2 is a block diagram of a conventional measurement system.
Figure 3:
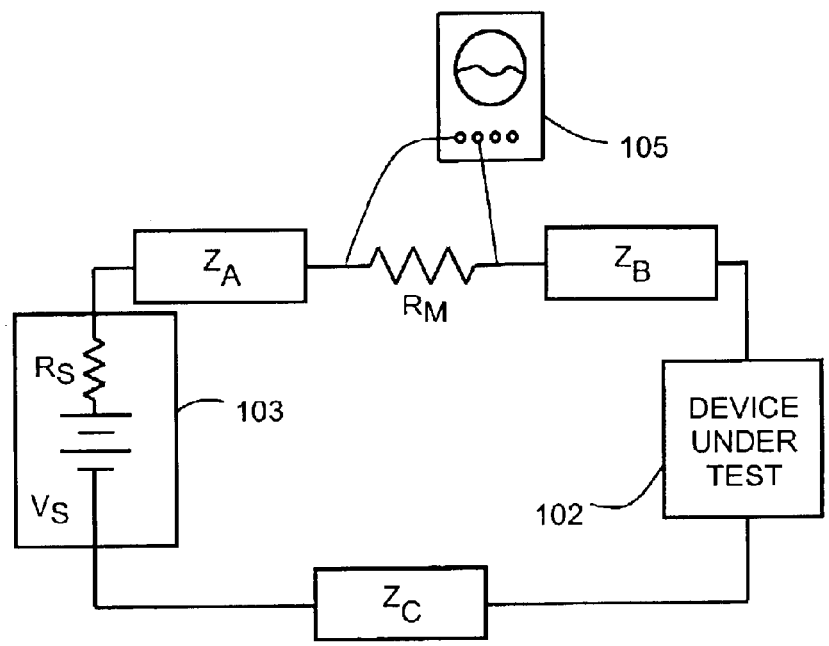
FIG. 3 is a block diagram of another conventional measurement system.
Figure 4:
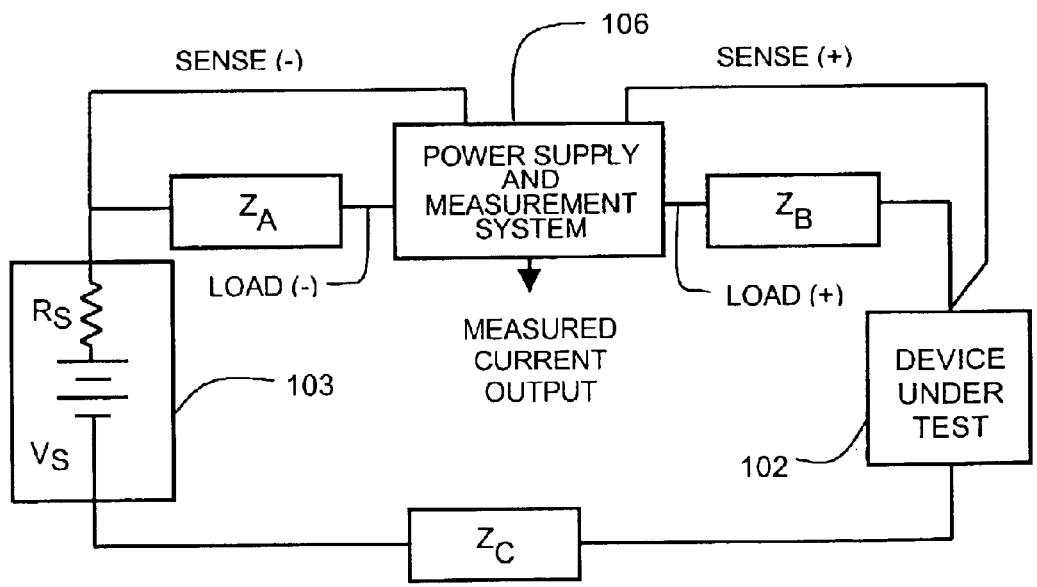
FIG. 4 is a block diagram of yet another conventional measurement system.
Figure 5:
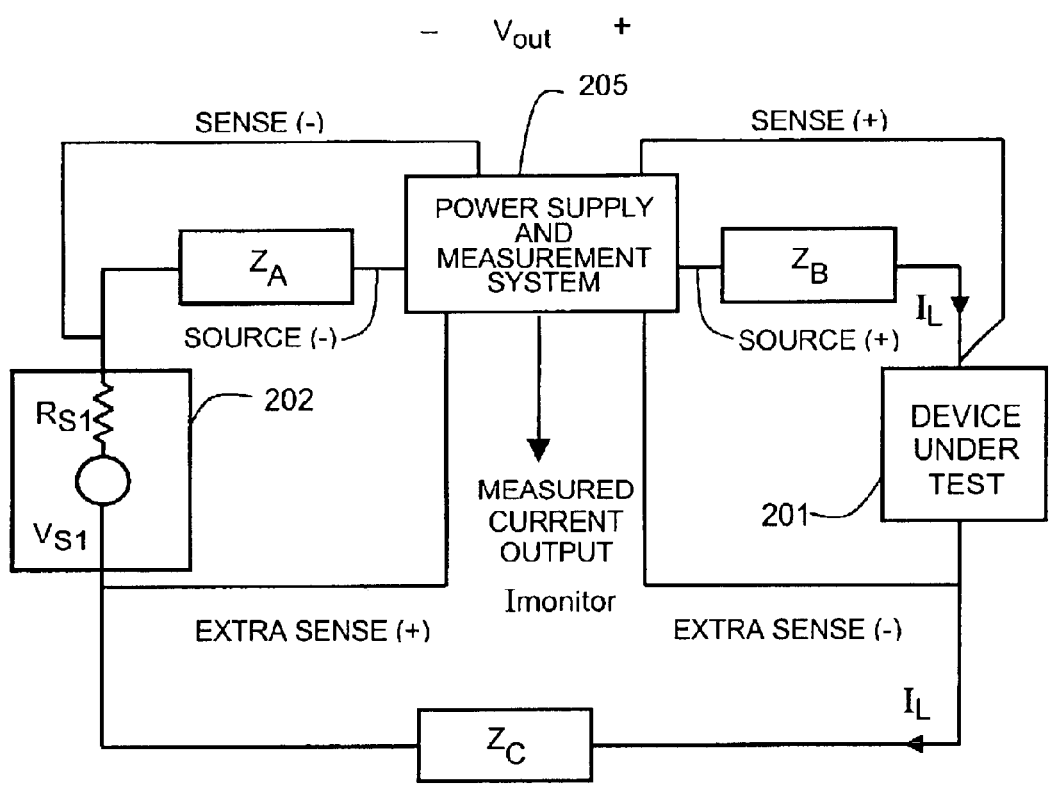
FIG. 5 is a block diagram of a measurement system according to the present invention.

A block diagram of an embodiment of the present invention is shown in FIG. 5. In the embodiment shown in FIG. 5, a device under test 201 is receiving a current $I_L$ supplied by a voltage source 202 via lumped parameter impedances $Z_A$, $Z_B$ and $Z_C$. The voltage source 202 comprises a voltage generator $V_{S1}$ and a source impedance represented by $R_{S1}$. The voltage generator $V_{S1}$ may be a battery, a direct current (DC) voltage source, an alternating current (AC) voltage source or a waveform generator voltage source, assuming that the power supply 205 can produce a bipolar voltage and current output. A power supply and measuring system 205 has outputs SOURCE(+) and SOURCE(−) which serially connect the voltage source 202 and the device under test 201 via the impedances $Z_A$ and $Z_B$. The power supply and measuring system 205 provides an output reading corresponding to the current supplied from the voltage source 202 to the device under test 201. Current is returned to the voltage source 202 from the device under test 201 via the impedance $Z_C$. A measure of the current flowing through the power supply and measuring system 205 is provided as an output Imonitor.

The power supply and measuring system 205 includes a first pair of sensing inputs SENSE(+) and SENSE(−), abbreviated S(+) and (S−), respectively, and a second pair of sensing inputs EXTRA SENSE(+) and EXTRA SENSE(−), abbreviated ES(+) and ES(−), respectively. The sensing input S(+) is connected at the device under test 201 on the load side of the impedance $Z_B$. The sensing input S(−) is connected at the voltage source 202 on the source side of the impedance $Z_A$. The sensing input ES (+) is connected at the voltage source 202 on a side opposite the sensing input S(−) and the sensing input ES(−) is connected at the load on a side opposite the sensing input S(+).

Figure 6:
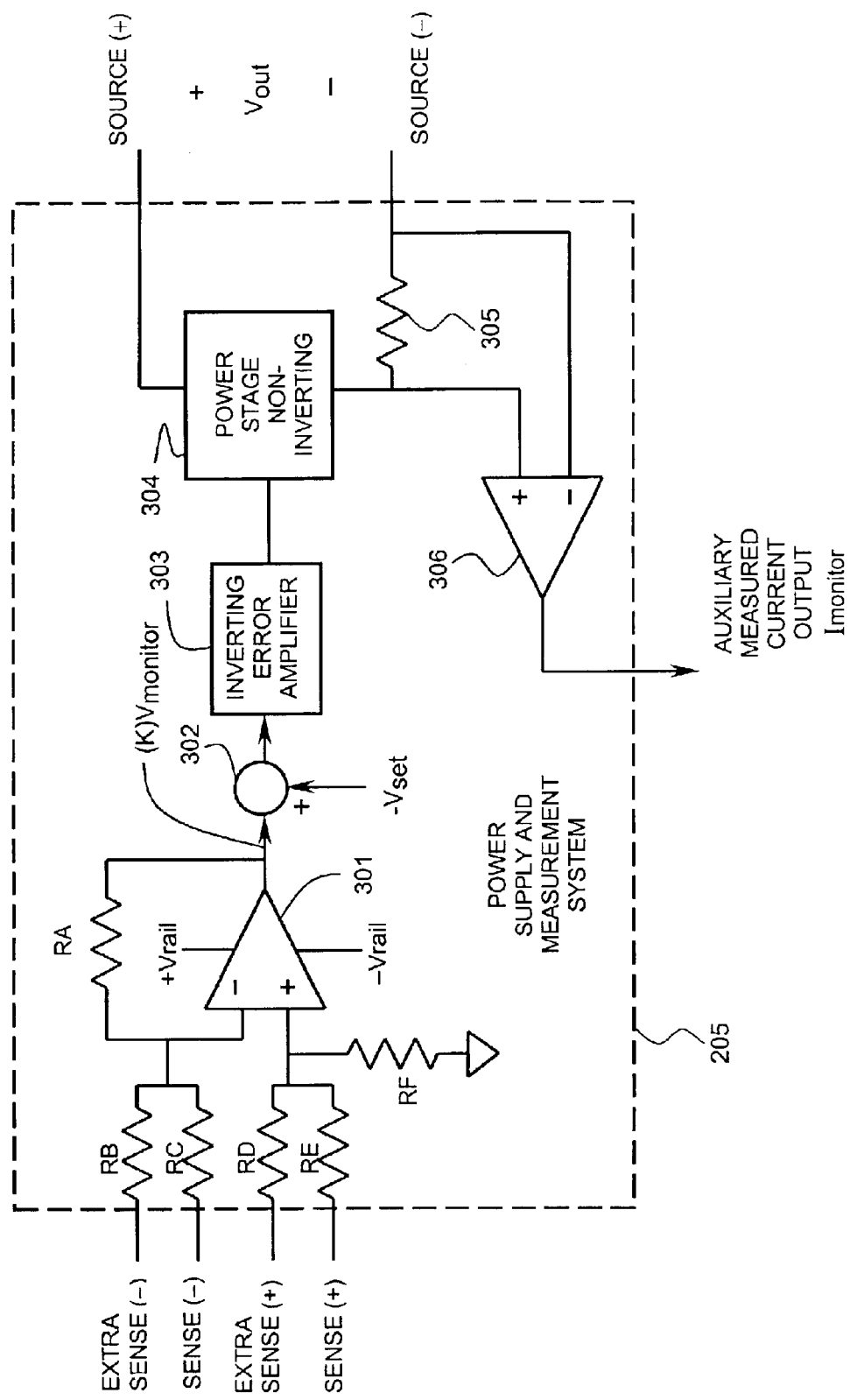
FIG. 6 is a schematic diagram of a portion of the measurement system shown in FIG. 5.

Referring to FIG. 6, a more detailed schematic of the power supply and measurement block 205 of FIG. 5 is shown. The S(+), S(−), ES(+), and ES(−) inputs are shown feeding dual input differential amplifier 301. With RB=RC and RD=RE differential amplifier 301 produces a control signal Vmonitor as shown in Equation (1) below. To maximize common mode rejection, values of RA through RF are set so that RA/RF=RB/RD=RC/RE.

$$[ES(+)-ES(-)]+[S(+)-S(-)]=(K)Vmonitor \quad (1)$$

$$\text{In Equation 1: } K = \frac{RA}{RB} = \frac{RA}{RC} \quad (2)$$

$$[ES(+)-ES(-)]=-I_L(Z_C) \quad (3)$$

and $$[S(+)-S(-)]=V_{out}-I_L(Z_A+Z_B). \quad (4)$$

Combining equations 1, 3 and 4 yields Equation (5).

$$[-I_L(Z_C)]+[V_{out}-I_L(Z_A+Z_B)]=KVmonitor \quad (5)$$

The feedback signal Vmonitor is summed with the power supply voltage set point, Vset by an adder 302 such that equation (6) is satisfied.

$$Vset=(K)Vmonitor \quad (6)$$

When Vset equals zero, (K)Vmonitor is equal zero. Substituting in equation 5 and solving for Vout yields Equation (7).

$$Vout=I_L(Z_A+Z_B+Z_C) \quad (7)$$

As a result, a total of errors introduced by the measurement system 205 and the impedances $Z_A$, $Z_B$ and $Z_C$ is reduced to zero, assuming error amplifier 301 has infinite dc gain. It is noted that $I_L$ could be either polarity, assuming the power supply is adapted to produce a bipolar output voltage and current.

Referring again to FIG. 6 the difference between Vset and Vmonitor is used to drive an inverting error amplifier 303. An output from the error amplifier 303 feeds a non-inverting power stage 304 which provides an output through the SOURCE (+) connection. Shunt 305 is used to measure the current returning through the SOURCE (−) connection. Instrumentation amplifier 306 measures the current flowing through the shunt 305 and provides the auxiliary measured current output Imonitor. Alternatively, the current measurement shunt 305 may be placed in the source (+) lead and achieve the same result as with the placement shown in FIG. 6.

The embodiment shown in FIG. 6 may be arranged to ensure that current flow through the sense leads is essentially zero and that essentially all of the load current flows thorough the measurement shunt 305. This is readily achievable by adding high impedance buffers to the sense leads.

Additionally, the functions described by Equations (1) may be implemented using separate equal gain instrumentation amplifiers where each of the instrumentation amplifiers has a Vmonitor output and the Vmonitor outputs are equally summed. Equation (1) may also be implemented using A/D converters with digital logic, or using external equipment.

Referring again to FIG. 5, due to the configuration of the sense leads, S(+), S(−), ES(+) and ES(−), any increase in the voltage drop that results between either the extra sense leads ES(+) and ES(−) or the sense leads S(+) and (S−) will cause an increase in the Vmonitor signal shown in FIG. 6. The increase of the Vmonitor signal will cause Vout to decrease proportionally to compensate. Consequently, the power supply and measurement system 205 is usable in a conventional two-wire sense configuration by either shorting or opening the extra sense leads ES(+) to ES(−). In this case, Equation (3) becomes ES(+)−ES(−)=0, thereby reducing Equation (1) to Equation (8).

$$S(+)-S(-)=(K)Vmonitor \quad (8)$$

The principles of the present invention have been explained by way of example using lumped parameter impedances $Z_A$, $Z_B$ and $Z_C$. However, the present invention is useable where the impedances $Z_A$, $Z_B$ and $Z_C$ are distributed parameter impedances or where it is desirable to measure currents in circuits having more impedances than $Z_A$, $Z_B$ and $Z_C$. For example, where it is desirable to consider the impedance $Z_C$ as impedances $Z_{C1}$, $Z_{C2}$, . . . $Z_{CN}$, additional extra sense (+) and extra sense (−) pickups may be employed to sense additional pairs of extra sense voltages and the additional pairs of extra sense voltages summed with the pair of extra sense voltages described above to provide an appropriate control voltage.

Although preferred embodiments of the present invention have been shown and described, it will be appreciated by those skilled in the art that changes may be made in these embodiments without departing from the principle and spirit of the invention, the scope of which is defined in the appended claims and their equivalents.

What is claimed is:

1. A system for measuring a current supplied from a supply voltage source having an output node and a first return node to a load having an input node and a second return node, wherein first and second impedances are serially connected between the output node and the input node and a third impedance is connected between the first and second return nodes, the system comprising:

a sensing system which senses voltages at the output node, the first return node, the input node and the second return node, respectively; and a controllable voltage source, serially connected with the first and second impedances and which interposes an intermediate voltage to cancel voltage drops due to the first, second and third impedances in response to the sensed voltages.

2. The system of claim 1, wherein:

the sensing system further comprises a summation network which subtracts a sum of a first pair of the sensed voltages from a sum of a second pair of the sensed voltages and outputs a control voltage; and the controllable voltage source cancels the voltage drops in response to the control voltage.

3. The system of claim 1, wherein the supply voltage source is a direct current voltage source.

4. The system of claim 3, wherein the direct current voltage source is a battery.

5. The system of claim 1, wherein the supply voltage source is an alternating current voltage source.

6. The system of claim 1, wherein the supply voltage source is a waveform generator voltage source.

7. A system for equalizing a voltage at a load to correspond to a supply source voltage, the supply source having an output node and a first return node and the load having an input node and a second return node, wherein first and second impedances are serially connected between the output node and the input node, a third impedance is connected between the first and second return nodes and a load current flows through the first, second and third impedances due to the source voltage, the system comprising:

a sensing network which senses voltages at the output node, the first return node, the input node and the second return node, respectively; and a controllable voltage source serially connected with the first and second impedances and which interposes an intermediate voltage to equalize the source voltage and the load voltage in response to the sensed voltages.

8. The system of claim 7, wherein:

the sensing network further comprising a summation network which subtracts a sum of a first pair of the sensed voltages from a sum of a second pair of the sensed voltages, and the serial voltage source equalizes the supply source voltage and the load voltage based on a result of the subtraction.

9. The system of claim 8, wherein the summation network comprises an operational amplifier which performs the subtraction.

10. A method of equalizing a voltage at a remote load to correspond to a supply source voltage, the supply source having an output node and a first return node and the load having an input node and a second return node, wherein first and second impedances are serially connected between the output node and the input node and a third impedance is connected between the first and second return nodes and a load current flows through the first, second and third impedances due to the source voltage, the method comprising:

sensing voltages at the output node, the first return node, the input node and the second return node, respectively; and connecting a controllable voltage source serially with the first and second impedances; and controlling the serially connected voltage source based in response to the sensed voltages to equalize the supply source voltage and the load voltage.

11. The method of claim 10, further comprising:

outputting a value of a current supplied by the controllable serial voltage source at an auxiliary output.

12. The method of claim 10, wherein the controlling of the serially connected voltage source comprises:

subtracting a sum of first pair of the sensed voltages from a sum of a second pair of the sensed voltages, and controlling the serially connected voltage source based on a result of the subtracting.

13. A system for measuring a current supplied from a supply voltage source to a load via a supply path and a return path, wherein at least one impedance is serially connected in the supply path and at least one impedance is serially connected in the return path, the system comprising:

a current measuring circuit which measures a current in one of the supply path and the return path;

a sensing system which senses at least one pair of voltages along the supply path and at least one pair of voltages along the return path; and a controllable voltage source serially connected with one of the supply path and the return path and which interposes an intermediate voltage to cancel voltage drops due to the serial impedances in response to the sensed voltages.

14. The system of claim 13, wherein the supply voltage source is a direct current voltage source.

15. The system of claim 14, wherein the direct current voltage source is a battery.

16. The system of claim 13, wherein the supply voltage is an alternating current voltage source.

17. The system of claim 13, wherein the supply voltage is a waveform generator voltage source.

18. The system of claim 13, wherein the intermediate voltage source further cancels an additional voltage drop due to the measuring circuit in response to the sensed voltages.

* * * * *